United States Patent [19]

Jambotkar

[11] 4,087,832
[45] May 2, 1978

[54] TWO-PHASE CHARGE COUPLED DEVICE STRUCTURE

[75] Inventor: Chakrapani G. Jambotkar, Hopewell Junction, N.Y.

[73] Assignee: International Business Machines Corporation, Armonk, N.Y.

[21] Appl. No.: 702,323

[22] Filed: Jul. 2, 1976

[51] Int. Cl.$^2$ .................. H01L 29/78; H01L 29/04; G11C 19/28
[52] U.S. Cl. ...................... 357/24; 357/59; 357/91; 307/221 D; 148/1.5
[58] Field of Search .................. 357/24, 59, 91; 307/221 D, 221 C

[56] References Cited

U.S. PATENT DOCUMENTS

| | | | |
|---|---|---|---|
| 3,796,932 | 3/1974 | Amelio et al. | 357/24 |
| 3,801,883 | 4/1974 | Tiemann | 357/24 |
| 3,858,232 | 12/1974 | Boyle et al. | 357/24 |
| 3,918,997 | 11/1975 | Mohsen et al. | 357/24 |
| 3,927,468 | 12/1975 | Anthony et al. | 357/24 |
| 3,932,775 | 1/1976 | Kosonooky | 357/24 |

OTHER PUBLICATIONS

Sequin "Two-Dimensional Charge-Transfer Arrays," IEEE J. Solid-State Circuits, vol. Sc.-9, (6/74), pp. 134–142.

Distefano, "Surface Charge Guides Using Heavily Doped Regions," IBM Technical Disclosure Bulletin, vol. 15, (7/72), pp. 435–436.

*Primary Examiner*—William D. Larkins
*Assistant Examiner*—Gene M. Munson
*Attorney, Agent, or Firm*—Henry Powers

[57] ABSTRACT

A semiconductor integrated charge coupled device is disclosed having an optimized minimum bit length for two-phase operation. Minimum spacing between created depletion regions and electrodes is obtained by having different ion implanted doping levels in the structure in correlation to overlying phase electrodes.

Also disclosed is means for segmenting a charge coupled device channel with provision for sensing of data in each channel segment to increase the speed of transfer of information from the device.

Also disclosed is a novel correlation of transfer or control electrodes of a CCD device with a source of phase clock pulses to provide directionality in a single CCD channel.

14 Claims, 17 Drawing Figures

TWO-PHASE CHARGE COUPLED DEVICE STRUCTURE

FIELD OF THE INVENTION

This invention relates to charge coupled device (CCD) technology, and more particularly to charge coupled semiconductor structures for use in image and/or dynamic storage applications.

DESCRIPTION OF THE PRIOR ART

Charge coupled devices have become well known in the prior art. There is continued investigation of CCD's for use in slow scan TV cameras, document readings, and other high sensitivity imaging applications. CCD's are also under investigation and study for use in memory systems and for shift register applications. Even though the CCD concept is relatively new, it is under continuous study and development for application in a large number of areas.

Charge coupled devices are basically metal-insulator-semiconductor devices which belong to a general class of structures which store and transfer information in the form of electrical charge. The charge-coupled device has been distinguished by the property that the semiconductor portion of devices is substantially homogenously doped, with regions of different conductivity being required only for injecting or extracting charges. A typical semiconductor charge-coupled device shift register is described, for example, in Boyle et al., Bell System Technical Journal, 49, 587, 1970. Basically, the CCD comprises a structure wherein a plurality of metal electrodes are disposed in a row over an insulator (dielectric) which in turn overlies and is contiguous with the surface of a semiconductor body. Sequential application of voltages to the metal electrodes induces potential wells adjacent the surface of the semiconductor body in which packets of excess minority carriers can be stored and between which these packets can be transferred. To insure composite directionality of charge packet transfer, the transfer potential well must be asymmetrical at least during the transfer operation. As discussed by W. S. Boyle and G. S. Smith in an article entitled "Charge Coupled Semiconductor Devices" B.S.T.J. April, 1970, pages 587-593, it was considered that at least three phase clock pulses are required to provide the requisite asymmetry for a uniform dielectric thickness under the gate electrode and a homogeneous semiconductor.

However, the three phase system suffers from the disadvantage of long bit lengths as defined by the accumulative width of the electrodes together with the spacing therebetween and a complex clocking requirement.

A two-phase CCD has the advantage of simpler clocking requirements and is generally fabricated by the use of overlapping gate electrodes and/or non-uniform dielectric thicknesses under the gate or transfer electrodes so that appropriately asymmetrical potential can be formed whenever a voltage is applied to any gate electrode. In any event, as in the three phase configuration, the bit length is defined by the accmulative width of the electrodes and the spacing therebetween. As is obvious, and reduction in the bit length of a CCD structure would permit greater densification of devices in an integrated structure and also improve the data transfer rate.

Also, charge coupled devices have been described for adaptation to the fabrication of an imaging array where for example a parallel readout of the array is first made to adjacent shift register with serial readout thereof to a sensing circuit. Typical imaging arrays are disclosed and described in U.S. Pat. Nos. 3,781,574 and 3,826,296 which employs a parallel readout of all active sensor elements in a row to a shift register stage with subsequent serial readout to the edge of the array where each charge packet is then transferred to a column transfer line and serial CCD shift register coupled to a simple readout circuit. Also, to increase the speed of the readout from the imaging array and minimize smearing of detected images, M. F. Tompsett et al. describe in an article entitled "Charge-Coupling Improves Its Image, Challenging Video Camera Tubes", on pages 162-169, Electronics, Jan. 18, 1973, another concept of information transfer from a scan area image into some bulk memory. One of these approaches is called a line-address scheme and the other is the frame-transfer scheme. In the frame-transfer scheme, the image area is distinct from the storage area, whereas in the line-address scheme, the image and storage areas are one and the same. The line-address approach affords almost half the chip size and resultant advantages such as better yields and cost reductions. In the line-address approach, in reported literature, an area image is first integrated for a time period, $T_1$, in the image area. At the end of the integration period, data transfer period, $T_2$, begins. During the transfer period, each line of the imaging area and storage area is transferred to a linear shift register at one end of the image/storage area and then transferred out to the output circuit to a bulk memory. For reducing image smearing to negligible proportions, the image integration period must be much greater, practically about 100 times, than that of the data transfer period. A reduction in the transfer period obviously affords a proportionate reduction in integration time. Accordingly, any reduction in the transfer of data from the imaging array would provide enhanced operation thereof.

SUMMARY OF THE INVENTION

Generally, the invention comprehends the fabrication of a charge coupled device incorporating in the body regions of a semiconductor substrate regions of different concentration of the same conductivity determining impurity or dopant in correlation with superposed phase electrodes which enables the compaction of the electrodes together with substantially zero spacing (e.g. 2,000 Angstroms) therebetween and the created asymmetrical depletion regions formed under them. Enhanced operation of the structure of this invention is affected by segmentation thereof with discrete or independent reading of information in each segmented portion of the CCD channel. This may be effected by physical segmentation of the CCD channel into sub-units, or by inducing flow of information in opposite directions from a predetermined point in the CCD channel with appropriate sensing of information at the distal downstream cells of the unit.

Accordingly, it is an object of this invention to provide a semiconductor device containing an improved charge-coupled array.

It is another object of this invention to provide a charge-coupled array which uses a semiconductor body having different doping levels therein aligned to the phase electrodes.

It is a further object of this invention to provide a high density charge-coupled array which has, by virtue of the short bit length, a high data transfer rate.

It is still another object of this invention to describe the process for producing this improved semi-conductor device.

The foregoing and other objects, features and advantages of this invention will be apparent from the following more particular description of preferred embodiments of the invention as illustrated in the accompanying drawings.

DESCRIPTION OF THE DRAWINGS

FIGS. 10-10B are simplified drawings of the electrode structure and operation of a prior art CCD array.

FIGS. 11-11B are simplified electrode configurations and phase operation thereof in accordance with another embodiment of this invention.

DESCRIPTION OF THE PREFERRED EMBODIMENTS

Figure 1:
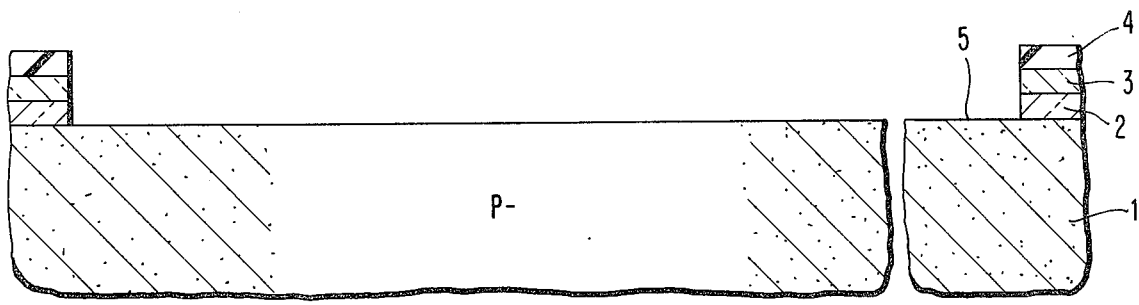
FIGS. 1-8 are schematic cross-sectional views illustrating various stages in the fabrication of a CCD array in accordance with this invention.
Figure 2:
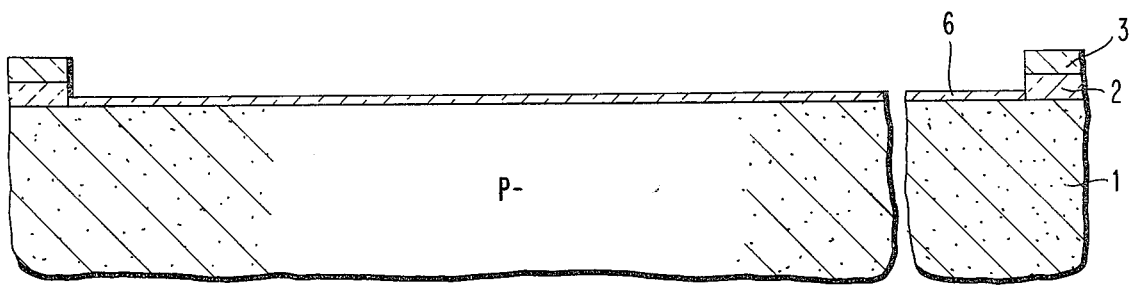
Figure 3:
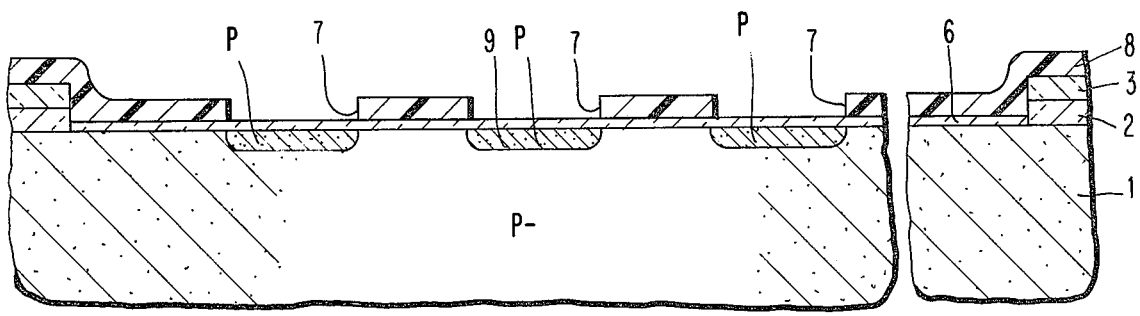
Figure 4:
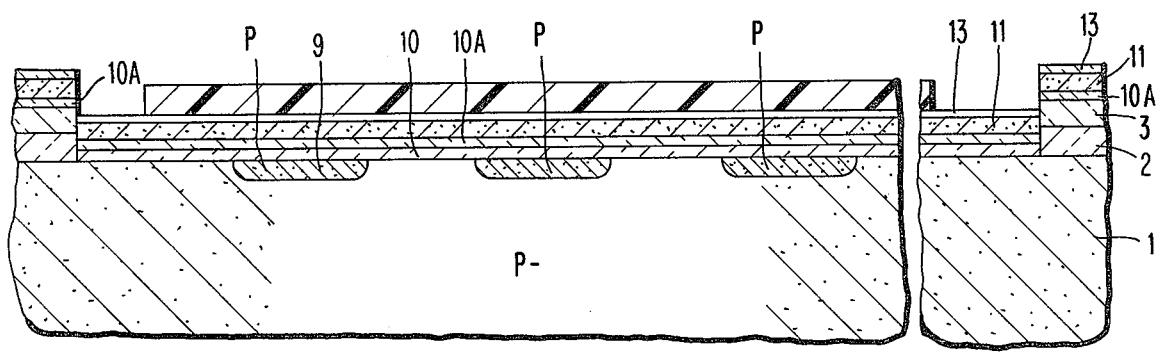
Figure 5:
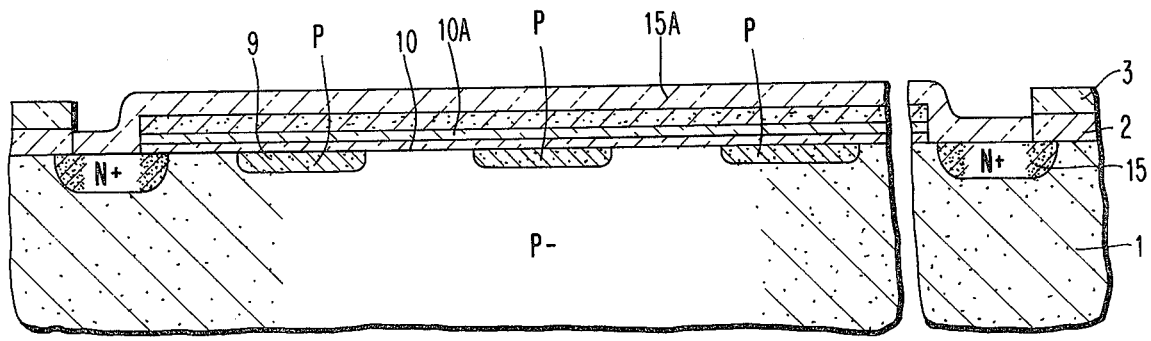
Figure 6:
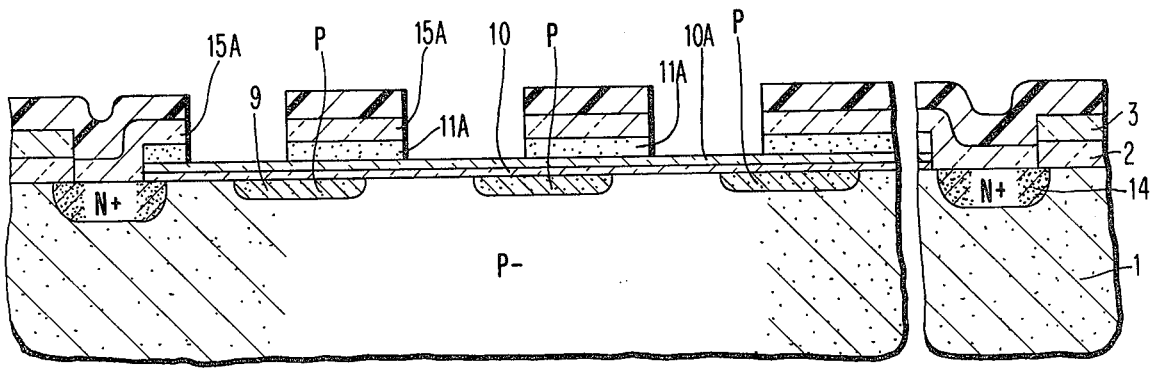

Although this invention will be described in conjunction with a charge coupled device structure fabricated in a monocrystalline semiconductor substrate of silicon, it is to be understood that any semiconductor material may be used for the fabrication of CCD devices in accordance with this invention which is capable of supporting surface charges of the type required in charge coupled structures. It should also be understood that the drawings employed herein are used to merely illustrate the invention and accordingly are not drawn to scale but rather designed merely to illustrate the principle of the invention by depicting only a small portion of a semiconductor substrate or chip which may be on the order of 200 by 200 mils.

As shown in the drawings, fabrication begins with a monocrystalline silicon substrate 1 on which is sequentially formed a thin, thermal oxide layer 2 of about 2,000 Angstroms and an overlying layer 3 of a pyrolytically deposited silicon oxide layer of about 8,000 Angstroms.

It should be noted and recognized that while a P-type semiconductor substrate is shown and described by way of example, an N-type semiconductor or semi-insulating mediums are also equally adaptable to the principles of the invention. Accordingly, it is to be understood that opposite type conductivity materials, as well as other insulation such as silicon nitride alone or in conjunction with silicon dioxide in composite form can also be utilized.

Further, it is to be understood that the fabrication of CCD devices in accordance with this invention employs conventional semiconductor fabrication techniques which are varied and well known in the art and consequently form no part of the present invention.

After formation of the thermal and pyrolytic oxide layers 2 and 3, the structure is overcoated with a suitable photoresist which is exposed and developed to provide a resist mask 4 defining a suitable opening for etching through the thermal and pyrolytic oxide layers 2 and 3 to bare a portion 5 of the top surface of semiconductor substrate 1.

In the next operation, a thin thermal oxide layer 6 of about 300 Angstroms is grown on the substrate surface 5 to serve as a screen for ion implantation. The second layer of a photoresist 8 is deposited over the structure, inclusive of the thin oxide layer 6 with suitable exposure and development to form windows 7. The substrate or wafer 1 is then ion implanted with an impurity determining ion such as boron through the exposed portion of screen oxide layer 6 to form doped regions 9, the remainder of the ions being captured by photoresist layer 8. Typically, the thickness of region 9 will be about 2000 Angstroms, with the surface concentration about five times the concentration of P-substrate. As indicated, a typical impurity to be ion implanted is boron resulting in regions 9 having a P-type impurity concentration higher than the bulk of silicon substrate 1.

The formation of the ion implanted regions 9 is followed by stripping of the photoresist 8 and etching away of the screen oxide layer 6. This is followed by growth of a thin thermal oxide layer 10 of about 300 Angstroms over the exposed silicon substrate. In the next operation, the silicon oxide layer 10 is covered with a silicon nitride layer 10A of about 300 Angstroms in accordance with well known and conventional chemical vapor deposition techniques. In the next operation, a polycrystalline silicon layer 11 of about 7,000 Angstroms heavily doped with N-type impurities is formed over the entire surface in a manner well known in the semiconductor art.

Windows 12 are next formed in the polycrystalline layer 11 by first depositing a layer 13 of pyrolytic silicon dioxide with a thickness of about 1,000 Angstroms over the top surface of the polycrystalline silicon 11. Selected portions of the silicon dioxide layer 13 are then removed from the top surface of the polycrystalline silicon 11 using well known photolithographic techniques to leave a pattern of the silicon dioxide layer 13 defining suitable openings for access to the portions of the polysilicon layer to be removed. The exposed portion of the polycrystalline silicon layer 11 is then removed down to the thin nitride layer 10A. Next, the photoresist is stripped away and the exposed layer of the nitride layer 10A is etched, followed by the etching away of the exposed portion of the thermal oxide layer 10 and the remainder of the oxide layer 13. Suitable etchants for etching silicon nitride and silicon dioxide are hot phosphoric acid and buffered hydrofluoric acid, respectively. The N+ regions 14 and 15 are then formed in the bare portions of the semiconductor substrate 1 by standard diffusion or ion implantation techniques followed by the usual drive indiffusion step. For the described semiconductor body 1, arsenic is preferably used as a dopant to create the N+ regions 14 and 15. The surface concentration of the N+ dopant is about $5 \times 10^{20}$ atoms/cc, the final junction depth of the N+ regions being about 1 micron. It will be understood that the polysilicon is also simultaneously doped at this point with the N+ dopant. After the creation of the N+ regions 14 and 15, the exposed surfaces of substrate 1 and the polysilicon 11 are thermally oxidized to obtain a layer of silicon dioxide 15A of about 3,000 Angstroms in thickness. As will be appreciated, the dopant is driven in during the oxidation and can be further driven in in an inert atmosphere subsequent to reoxidation.

It is to be understood that the formation of doped regions 14 and 15 comprises means for injecting and detecting minority carriers in the CCD device which are well known in the art and form no part of the present invention. It is also to be understood that another method of supplying minority carriers is due to generation of whole-electron pairs by photon absorption and, accordingly, it will be appreciated that the invention described herein is comprehended for use as a line or area imaging device.

Using photoresist, a selective etching operation is now successively performed in the top oxide layer 15A and the polycrystalline silicon layer 11 to define polycrystalline silicon electrodes 11A. This is followed by subjecting the unit to thermal oxidation to form layers 16 of silicon dioxide around the sides and the top of the polycrystalline silicon electrodes 11A. As will be appreciated, no oxide is grown or formed on the exposed portions of the thin silicon nitride layers 10A.

Figure 7:
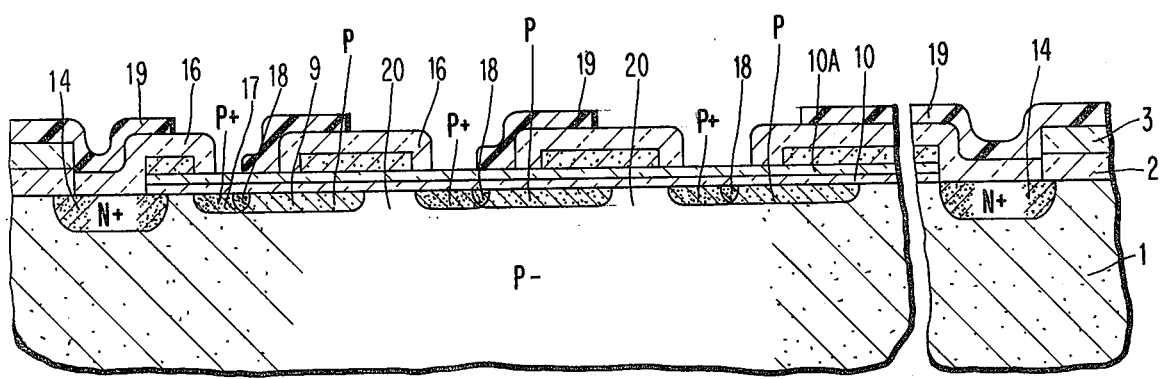

A further photoresist layer 19 is formed over the structure and suitably developed in the configuration shown in FIG. 7 for ion implantation of regions 17 in a continuation from the ion implanted regions 9 with slight overlap at portion 18. The ion implanted region 17 is sufficiently doped with an ion of the same conductivity determining type as region 9 but in higher concentration normally about five times higher than that of region 9 with about the same depth as region 9.

After the last ion implantation step, the photoresist layer 19 is removed and a new photoresist layer 21 is applied for the formation of the contact 22. Electrode 23 of a conductive aluminum/silicon composition in a thickness of about 1 micron is obtained by depositing the aluminum/silicon composition by conventional evaporation techniques used in metallizing integrated circuits. The specific electrode configuration or pattern is defined on the aluminum/silicon by photolithographic masking and etching processes. An indicated previously, this involves applying a photoresist to the surface, exposing the photoresist to light through a mask of the pattern desired, and then developing the photoresist. The portion of the aluminum/silicon layer not protected by the photoresist pattern is removed with a suitable etchant.

As will be appreciated for imaging applications, the field or transfer electrode 23 must be at least semitransparent (ideally 100% transparent), and accordingly may be fabricated by use of very thin layers of chromium, nichrome, and/or gold of about 100 Angstroms in total thickness. It may be also expected that indium oxide, layers of which exhibit very high optical transmission coefficients, may also be used typically in a thickness of about 0.5 microns (5,000 Angstroms).

Figure 8:
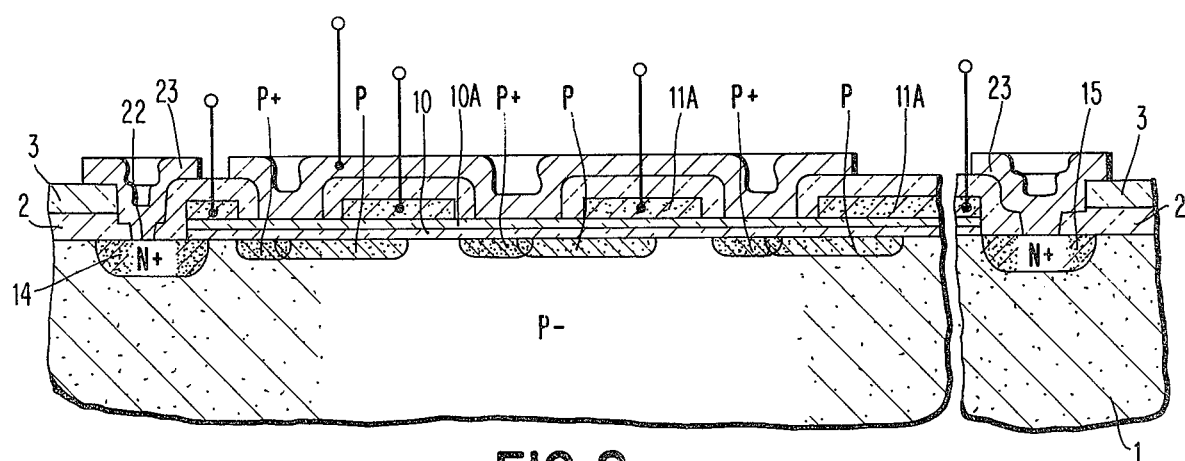
Figure 8A:
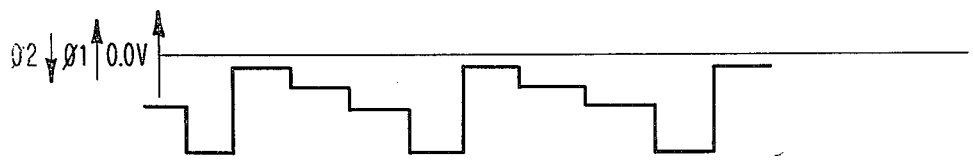
FIGS. 8A and 8B depict waveforms illustrating the operation of the CCD array shown in FIG. 8.
Figure 8B:
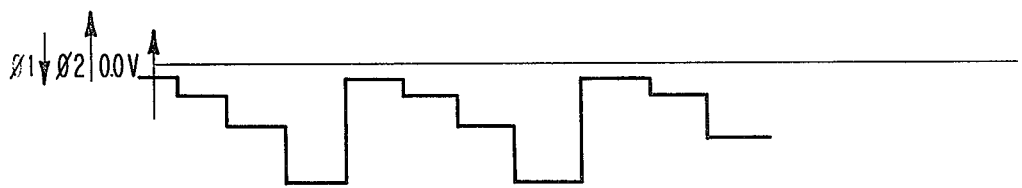

A portion of the final structure is shown in FIG. 8 with its operation illustrated by depletion or potential profiles of FIGS. 8A and 8B.

Figure 9:
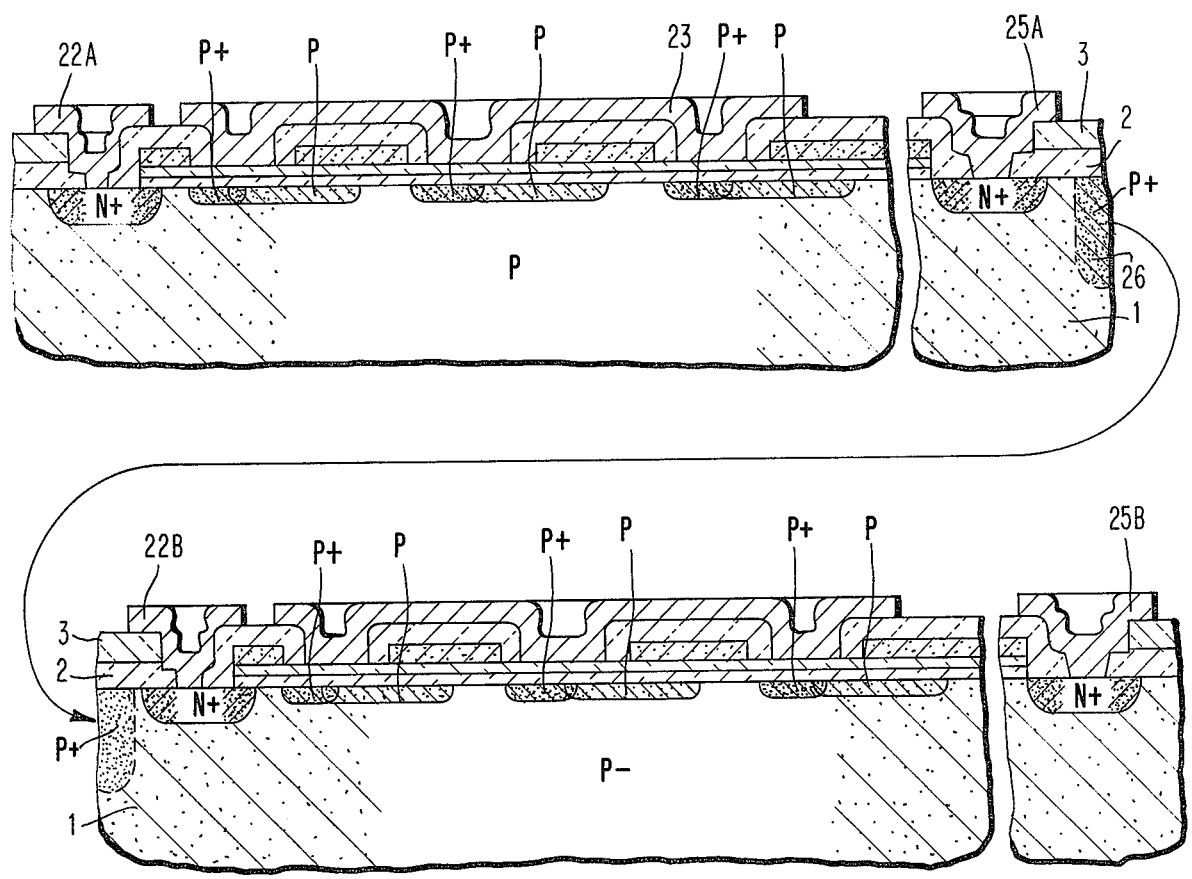
FIG. 9 is a schematic cross-sectional view illustrating another embodiment in accordance with this invention.

FIG. 9 illustrates another embodiment of this invention in which the above CCD structures (as well as heretofore conventional structures) can be segmented into sub-channels where data can be inputted at terminals 22A and 22B and sensed at each of output terminals 25A and 25B. As will be appreciated, when the CCD structures are adapted for imaging applications, plural portions of the information can be shifted towards output terminals 25A and 25B reducing the time for transferring of information. The segmentation on the CCD channel is formed by formation of a heavily doped P++ region 26 by conventional photolithographic techniques at any appropriate point in the fabrication of the device. These P-type diffusions are known as channel stops which create potential barriers at an intermediate point of the CCD channel as illustrated schematically in FIG. 9. As will be understood, the purpose of the channel stop diffusion is to prevent flow of charge from one portion of the channel to the succeeding portion of the channel. The impurity concentration of the P-type channel stop diffusion should be sufficiently high (e.g. about two or three orders of magnitude higher than the substrate impurity concentration to a depth of about 5,000 Angstroms) so that the voltage of transfer electrodes 11A and 23 which pass over the diffusions will cause substantially no depletion to occur and therefore effective potential barriers will be obtained where desired.

It may be noted with respect to the CCD devices in accordance with this invention that, for a given state of the art in photolithography, width W and spacing S being the minimum allowable width and spacing for polysilicon thin film patterns, the above process will provide a bit length of about W + S. For example, a state of the art provides the attainment of W of about 0.2 mils and spacings of about 0.15 mils, then the above process provides a bit length of about 0.35 mils.

Also, the invention provides a CCD structure amenable to simple two-phase clocking or uni-phase clocking where one-phase is dc. For two-phase clocking, the phase identified as phase 1 must have voltage amplitudes higher than phase 2 inasmuch as substrate surface under phase 1 gates is heavier in doping compared to phase 2 areas. Directionality required in two-phase or uni-phase clocking is provided by the proposed structure through unequal doping of the substrate surface (i.e., regions 9 and 17 under phase 1 electrodes and regions 17 and 20 under phase 2 electrodes). It is also to be understood that although the process as described above will yield surface channel operation of charge coupled devices, a buried channel operation can be readily obtained through a 1-3 micron layer of N doping on the P⁻ substrate. Also, the structures are characterized with self-aligned FET type circuitry whose simultaneous fabrication is directly provided by the described process.

Figure 10:
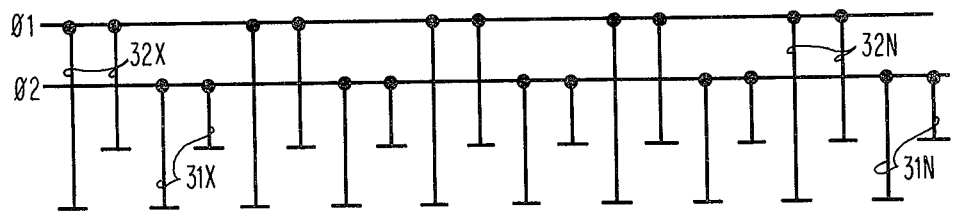
Figure 10:
Figure 10:
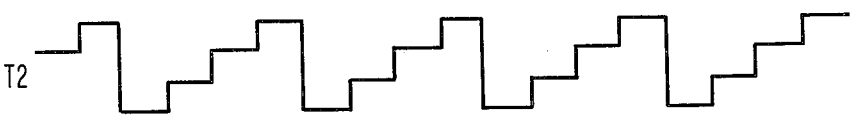
Figure 11:
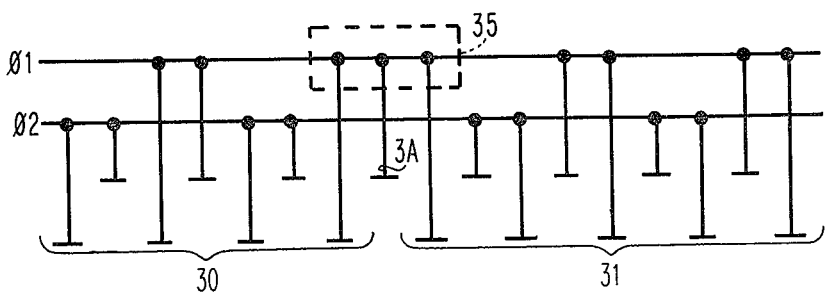
Figure 11:
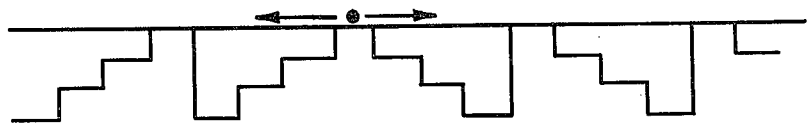
Figure 11:
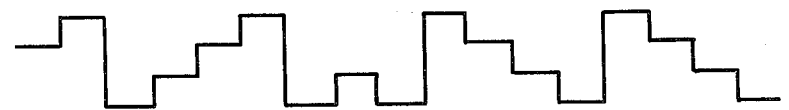

FIG. 11 illustrates another embodiment of this invention in which multi-directional bit flow can be induced in a CCD channel, with operational comparison illustrated with respect to conventional electrode phase operation illustrated in FIG. 10. Although any electrode configuration can be employed, the multi-directional induced bit flow is illustrated with respect to electrodes 32X to 32N and 31X to 31N. In the specific form shown, the charge storage electrodes comprise electrode pairs with each pair including a polysilicon electrode such as 31 which is spaced, in a stepped manner, relatively close to a semiconductor substrate and a metal electrode 32, as of aluminum, which is also spaced in a stepped manner close to the substrate. This pair of electrodes is driven by the same voltage phases such as phase 1, and the other adjacent pairs by phase 2 which form an asymmetrical potential well in a substrate for storage and shifting of charges in conjunction with voltage phase 2. The conventional configuration of electrodes and their connection to a source of phase clock pulses is shown in FIG. 10 in conjunction with potential or depletion profiles of FIGS. 10A and 10B. The invention as illustrated in FIG. 11 comprehends a substantially identical configuration of electrodes concentrically configured about an intermediate point 35 of the CCD channel into concentric groups 30 and 31 with the utilization of one of electrodes 32 as a control electrode 3A so as to induce bit flow in a channel in opposite directions away from the intermediate point 35. The depletion or potential profiles of the operation of the structure of FIG. 11 is shown in FIGS. 11A and 11B.

It is to be understood that while the invention has been particularly shown and described with reference to preferred embodiments, it will be understood by those skilled in the art that various changes in form and detail may be made therein without departing from the spirit and scope of the invention.

What is claimed is:

1. A charge coupled device comprising:
   A. a semiconductor substrate of a selected conductivity type;
   B. insulation over said substrate;
   C. a plurality of sequential storage cells in said substrate forming a shift register channel, and comprising
   D. each cell having two adjacent cell electrodes disposed downstream on said insulation along said channel, and with each cell including
   E. a first ion implanted region in said substrate adjacent said insulation and extending from upstream distal end of said cell to an intermediate portion of the upstream one of said cell electrodes, with said first region comprising a substantially uniform distribution of a dopant of said conductivity type in greater concentration than in said substrate; and
   F. a second ion implanted region forming an extension of said first region and continuing downstream in said channel to an intermediate portion of the downstream one of said cell electrodes, said second region having a substantial uniform distribution of a dopant of said conductivity type in concentration intermediate said substrate and said first region.

2. The device of claim 1 wherein said electrodes are transparent adapting said device for image sensing applications.

3. The device of claim 2 wherein the said upstream electrodes of each cell comprise a continuous extension of a conductive metal, and said downstream electrodes of each cell comprise polycrystalline silicon in insulated relationship to said upstream electrodes.

4. The device of claim 1 including means for injecting a charge into at least one cell of said device, and means for sensing charge flow in a downstream cell of said channel.

5. The device of claim 1 including channel stop means in an intermediate portion of said channel for subdivision thereof into sub-channels, and means for sensing output charges in said sub-channels.

6. The device of claim 1 including a plurality of clock pulse sources for shifting charges in said device with a said source connected to said electrodes of a pair of cells, said connected electrodes being disposed an equal distance from an intermediate point in said channel; and a control electrode connected to a said source and disposed above a said cell at said intermediate point for inducing charge flow in opposite directions from said intermediate point.

7. The device of claim 1 wherein the said upstream electrodes of each cell comprise a continuous extension of a conductive metal, and said downstream electrodes of each cell comprise polycrystalline silicon in insulated relationship to said upstream electrodes.

8. The device of claim 7 including a plurality of clock pulse sources for shifting charges in said device with a said source connected to said electrodes of a pair of cells, said connected electrodes being disposed in equal distance from an intermediate point an said channel; and a control electrode connected to a said source and disposed above a said cell at said intermediate point for inducing charge flow in opposite directions from said intermediate point.

9. The device of claim 8 including means for injecting a charge into at least one cell of said device, and means for sensing charge flow in a downstream cell of said channel.

10. The device of claim 7 wherein said electrodes are transparent adapting said device for image sensing applications.

11. The device of claim 10 including means for injecting a charge into at least one cell of said device, and means for sensing charge flow in a downstream cells of said channel.

12. The device of claim 7 including channel stop means in an intermediate portion of said channel for subdivision thereof into sub-channels, and means for sensing output charges in said sub-channels.

13. The device of claim 12 including means for injecting a charge into at least one cell of said device, and means for sensing charge flow in a downstream cell of said channel.

14. The device of claim 7 including means for injecting a charge into at least one cell of said device, and means for sensing charge flow in a downstream cell of said channel.

* * * * *